(12) United States Patent
Yu

(10) Patent No.: US 11,137,537 B2
(45) Date of Patent: Oct. 5, 2021

(54) AREA LIGHT SOURCE ASSEMBLY, BACKLIGHT MODULE AND LIQUID CRYSTAL DISPLAY

(71) Applicant: JRD COMMUNICATION (SHENZHEN) LTD, Shenzhen (CN)

(72) Inventor: Yang Yu, Shenzhen (CN)

(73) Assignee: JRD COMMUNICATION (SHENZHEN) LTD, Shenzhen (CN)

( * ) Notice: Subject to any disclaimer, the term of this patent is extended or adjusted under 35 U.S.C. 154(b) by 0 days.

(21) Appl. No.: 16/699,754

(22) Filed: Dec. 2, 2019

(65) Prior Publication Data

US 2020/0103577 A1    Apr. 2, 2020

Related U.S. Application Data

(63) Continuation of application No. PCT/CN2018/090827, filed on Jun. 12, 2018.

(30) Foreign Application Priority Data

Jun. 12, 2017 (CN) .......................... 201710439112.0

(51) Int. Cl.
G02F 1/1333 (2006.01)
F21V 8/00 (2006.01)
H05K 1/18 (2006.01)

(52) U.S. Cl.
CPC ........... *G02B 6/009* (2013.01); *G02B 6/0031* (2013.01); *G02B 6/0043* (2013.01);
(Continued)

(58) Field of Classification Search
CPC ................................................ G02F 1/133308
See application file for complete search history.

(56) References Cited

U.S. PATENT DOCUMENTS

2001/0036068 A1    11/2001  Masaru et al.
2002/0015297 A1*   2/2002   Hayashi ............ G02F 1/133604
                                                     362/23.16
(Continued)

FOREIGN PATENT DOCUMENTS

CN        101726917 A      6/2010
CN        105371236 A      3/2016
(Continued)

OTHER PUBLICATIONS

International search report,PCT/CN2018090827, dated Sep. 10, 2018 (3 pages).
(Continued)

*Primary Examiner* — Edmond C Lau

(57) ABSTRACT

Disclosed is an area light source assembly, wherein the assembly comprises: a light guide plate comprising a flat plate portion and an accommodation portion, the flat plate portion comprising a light incident side face and a light emitting top face, and the accommodation portion being smoothly connected to the light incident side face; and a light source arranged in the accommodation portion and having a light-emitting face facing the light incident side face of the flat plate portion, the thickness of the flat plate portion being less than the thickness of the light source. Further disclosed are a backlight module having the area light source assembly, and a liquid crystal display.

19 Claims, 1 Drawing Sheet

(52) U.S. Cl.
CPC ......... *G02B 6/0073* (2013.01); *G02B 6/0088* (2013.01); *G02F 1/133308* (2013.01); *H05K 1/189* (2013.01); *G02F 1/133314* (2021.01); *H05K 2201/10106* (2013.01)

(56) References Cited

U.S. PATENT DOCUMENTS

| | | | | |
|---|---|---|---|---|
| 2006/0198163 | A1* | 9/2006 | Tsai | G02B 6/0061 |
| | | | | 362/627 |
| 2013/0070476 | A1* | 3/2013 | Kunimochi | G02B 6/0083 |
| | | | | 362/606 |
| 2014/0055703 | A1* | 2/2014 | Gu | G02B 6/0085 |
| | | | | 349/58 |
| 2015/0260908 | A1* | 9/2015 | Kiguchi | G02B 6/009 |
| | | | | 349/58 |
| 2018/0031900 | A1* | 2/2018 | You | G02B 6/0071 |

FOREIGN PATENT DOCUMENTS

| | | |
|---|---|---|
| CN | 205809489 U | 12/2016 |
| CN | 106483704 A | 3/2017 |
| CN | 107102476 A | 8/2017 |

OTHER PUBLICATIONS

First Office Action from China patene office in a counterpart Chinese patent Application 201710439112.0, dated Mar. 25, 2019 (7 pages).

\* cited by examiner

AREA LIGHT SOURCE ASSEMBLY, BACKLIGHT MODULE AND LIQUID CRYSTAL DISPLAY

CROSS-REFERENCE TO RELATED APPLICATION

The present application is a continuation-application of International (PCT) Patent Application No. PCT/CN2018/090827 filed on Jun. 12, 2018, which claims foreign priority of Chinese Patent Application No. 201710439112.0, filed on Jun. 12, 2017 in the State Intellectual Property Office of China, the entire contents of which are hereby incorporated by reference.

TECHNICAL FIELD

The present disclosure generally relates to the liquid display technology, and in particular to an area light source assembly, a backlight module and a liquid crystal display.

BACKGROUND

With the development of photoelectric and semiconductor technology, flat panel displays are also well developed. Among various kinds of flat panel displays, liquid crystal displays (LCD) have become a market mainstream because of its advantageous performances such as high space utilization efficiency, low consumption, no radiation and resistance to electromagnetic interruption.

In general, a liquid crystal display includes a liquid crystal panel and a backlight module (BL). Since the liquid crystal panel cannot generate light itself, a backlight module is necessarily arranged behind the liquid crystal panel and functions as an area light source for the liquid crystal panel. In this way, the liquid crystal panel may display images by using the area light source provided by the backlight module.

In recent years, as the design requirement makes liquid crystal displays thinner and thinner, backlight modules are correspondingly required to become thinner. Traditional method for reducing the thickness of a backlight module includes determining the thickness of the light guide plate based on the thickness of the light source (e.g., LED), reducing the thickness of other sheets (e.g., optical diaphragms) or diminishing gaps between theses sheets and so on. However, the space for reducing the thickness of the whole backlight by using the above method is very limited, and diminishing gaps between the sheets may reduce reliability of the structure.

SUMMARY

Accordingly, the present disclosure provides an area light source assembly, a backlight module and a liquid crystal display. According to the present disclosure, the space for reducing the thickness of the backlight module can be augmented without diminishing gaps between other sheets.

According to an aspect of the present disclosure, an area light source assembly is provided. The area light source assembly may include a light guide plate and a light source. The light guide plate may include a flat plate portion and an accommodation portion. The flat plate portion may include a light incident side face and a light emitting top face. The accommodation portion may be smoothly connected to the light incident side face. The light source may be received in the accommodation portion, and a light-emitting face of the light source may face the light incident side face of the flat plate portion. The thickness of the flat plate portion may be less than that of the light source.

In some embodiments, the accommodation portion may include a bent plate, a horizontal plate and a vertical plate. A first end of the bent plate may be smoothly connected to the light incident side surface. A second end of the bent plate may be connected to a first end of the horizontal plate. A second end of the horizontal plate may be connected to a first end of the vertical plate. An end surface of a second end of the vertical plate may be flush with the light emitting top face. A normal direction of the horizontal plate may be parallel to a normal direction of the light emitting top face, and a normal direction of the vertical plate may be parallel to a normal direction of the light incident side face.

In some embodiments, the light source may include an LED light and a flexible printed circuit. The LED light may include the light-emitting face, a fixing surface opposite to the light-emitting face, and a connecting surface connected to the light-emitting face and the fixing surface. The connecting surface may be set on the flexible printed circuit. The flexible printed circuit may be arranged on an inner surface of the horizontal plate. The fixing surface may be fixed on an inner surface of the vertical plate. The light-emitting face may face the light incident side face.

In some embodiments, at least one of the inner surface of the bent plate, the inner surface of the horizontal plate and the inner surface of the vertical plate may be arranged with a light reflection layer. In this way, utilization of light emitted by the light source may be improved.

In some embodiments, the light guide plate may further include a reflection portion located between the light emitting top face and the another end of the vertical plate so as to cover an opening between the light emitting top face and the another end of the vertical plate. In this way, light reaching at the opening may be reflected back such that utilization of light emitted by the light source may be further improved.

According to another aspect of the present disclosure, a backlight module is provided. The backlight module may include the above-mentioned area light source assembly, a back-frame and multiple optical diaphragms. The back-frame may include a bottom plate and a side plate extending from the bottom plate. The area light source assembly may be set on the bottom plate. The light emitting top face may be opposite to the bottom plate. The optical diaphragms may be successively arranged on the light emitting top face.

In some embodiments, the backlight module may further include a reflection sheet located between the bottom plate and a bottom surface of the light guide plate. The bottom surface of the light guide plate may be opposite to and parallel to the light emitting top face. The light incident side face may be connected between the bottom surface and the light emitting top face. In this implementation, the reflection sheet can reflect light arriving at its bottom surface back to the light guide plate such that utilization of light can be improved.

In some embodiments, the bottom surface may be arranged with multiple dot-patterns. In this implementation, total reflection in the light guide plate can be prevented such that light distribution may be more even.

In some embodiments, the side plate may include a supporting plate extending inward from an inner surface of the side plate and parallel to the bottom plate. The supporting plate is located above the optical diaphragms for supporting a liquid crystal panel.

According to yet another aspect of the present disclosure, a liquid crystal display is provided. The liquid crystal display may include the above-mentioned backlight module and a liquid display panel supported by the supporting plate of the backlight module.

In the present disclosure, where light rays emitted by the backlight module satisfy a pre-determined light amount, pre-determined light brightness, a pre-determined optical property, etc., the thickness of the flat plate portion of the light guide plate can be adjusted at will, it thereby being possible to broaden the space of thinning of the backlight module without diminishing the gaps between other sheets.

BRIEF DESCRIPTION OF THE DRAWINGS

In order to clearly explain the technical solutions in the embodiments of the present disclosure, the drawings used in the description of the embodiments will be briefly described below.

DETAILED DESCRIPTION

Figure 1:
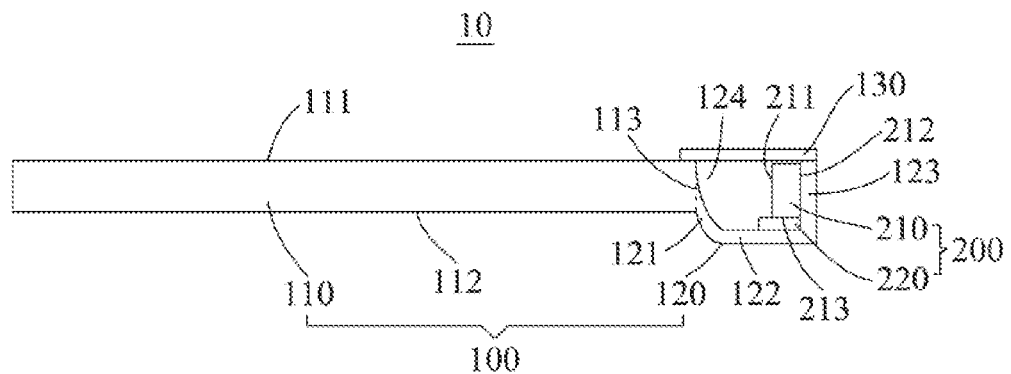
FIG. 1 is a structural diagram of an area light source assembly according to an embodiment of the present disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein. Rather, these embodiments are provided for explaining the principle and actual application of the present disclosure, thus other skilled in the art can understand various embodiments and amendments which are suitable for specific intended applications of the present disclosure.

In the drawings, the same reference numerals will be used throughout to designate the same of like elements. It will be understood that, although the terms first, second, etc. may be used hereinto describe various elements, these elements should not be limited by these terms. There terms are only used to distinguish one element from another.

FIG. 1 is a structural diagram of an area light source assembly according to an embodiment of the present disclosure.

As shown in FIG. 1, in some embodiments of the present disclosure, the area light source assembly 10 may include a light guide plate 100 and a light source 200.

Specifically, the light guide plate 100 may include a flat plate portion 110 and an accommodation portion 120. The accommodation portion 120 may be located at one side of the flat plate portion 110. The accommodation portion 120 and the flat plate portion 110 may be an integral structure, but are not limited thereto.

The flat plate portion 110 may include a light emitting top face 111, a bottom face 112 and a light incident side face 113 (shown in dot line). The light emitting top face 111 and the bottom face 112 may be parallel to each other. The light incident side face 113 may be connected at the same side of the light emitting top face 111 and the bottom face 112. The accommodation portion 120 may be smoothly connected to the light incident side face 113. The light source 200 may be received in the accommodation portion 120 and a light-emitting face 211 of the light source 200 may face the light incident side face 113. Thus, light emitted by the light source 200 may enter into the light guide plate 100 through the light incident side face 113, and exit out from the light emitting top face 111 after being reflected by the light guide plate 100 to become evenly distributed area light.

In this embodiment, with the combination of the light guide plate 100 and the light source 200, where light rays emitted from the light emitting top face 111 satisfy a pre-determined light amount, pre-determined light brightness, a pre-determined optical property, etc., the thickness of the flat plate portion 110 can be adjusted at will. In this implementation, the thickness of the flat plate portion 110 may be less than the thickness of the light source 200 so as to reduce the thickness of the backlight module (please see the next embodiment).

In this embodiment, the accommodation portion 120 may include a bent plate 121, a horizontal plate 122 and a vertical plate 123. A first end of the bent plate 121 may be smoothly connected to the light incident side face 113, a second end of the bent plate 121 may be connected to a first end of the horizontal plate 122. A second end of the horizontal plate 122 may be connected to a first end of the vertical plate 123, and an end surface of a second end of the vertical plate 123 may be flush with the light emitting top face 111. In this implementation, the bent plate 121, the horizontal plate 122 and the vertical plate 123 cooperatively define an accommodation cavity 124 having an opening. The opening may be located between the second end of the vertical plate 123 and the light emitting top face 11. Moreover, the bent plate 121 may extend in a direction away from the accommodation cavity 124, namely, the bent plate 121 may bend outwardly.

Furthermore, a normal direction of the horizontal plate 122 may be parallel to a normal direction of the light emitting top face 111. That is, the horizontal plate 122 may be parallel to the light emitting top face 111 and the bottom face 112. A normal direction of the vertical plate 123 may be parallel to a normal direction of the light incident side face 113. That is, the vertical plate 123 may be parallel to the light incident side face 113.

It should be noticed, the structure of the accommodation portion 120 described above is merely one exemplary embodiment, and the structure of the accommodation portion 120 of the present disclosure is not limited thereto.

Further, in this embodiment, the light source 200 may include a LED light 210 and a flexible printed circuit 220. The LED light 210 may include a light-emitting face 211, a fixing face 212 opposite to the light-emitting face 211 and a connecting face 213 connected to both the light-emitting face 211 and the fixing face 212. The connecting face 213 may be set on the flexible printed circuit 220 such that the LED light 210 may be electrically connected to the flexible printed circuit 220. The flexible printed circuit 220 may be arranged on the inner surface of the horizontal plate 122. The fixing face 212 may be fixed on the inner surface of the vertical plate 123. The light-emitting face 211 may face the light incident side face 113. In this implementation, the thickness of the light source 200 may be equal to the sum of the thickness of the LED light 210 and the thickness of the flexible printed circuit 220. It should be noticed, the structure of the light source 200 described above may be merely one exemplary embodiment of the present disclosure, and the structure of the light source 200 of the present disclosure is not limited thereto.

In order to improve light utilization emitted by the LED light 210, in this embodiment, at least one of the inner surfaces of the bent plate 121, the horizontal plate 122 and the vertical plate 123 may be arranged with a light reflection layer (not shown). In this way, the light reflection layer may reflect back light reaching to the bent plate 121, the horizontal plate 122 and/or the vertical plate 123, such that more light may enter to the light incident side face 113. It should be noticed, for the bent plate 121, only the inner surface of the portion of the bent plate 121 which is not connected to the light incident side face 113 may be arranged with the light reflection layer.

Since the accommodation cavity 124 has an opening, light emitted by the LED light 210 may exit through the opening and be wasted. Thus, in order to improve light utilization emitted from the LED light 210, the light guide plate 100 may further include a reflection portion 130. The reflection portion 130 may be arranged between the second end of the vertical plate 123 and the light emitting top face 111 to cover the opening between the second end of the vertical plate 123 and the light emitting top face 111 (i.e., the opening of the accommodation cavity 124). In this implementation, light reaching to the reflection portion 130 may be reflected back into the accommodation cavity 124 by the reflection portion 130, and thereby improving light utilization.

Figure 2:
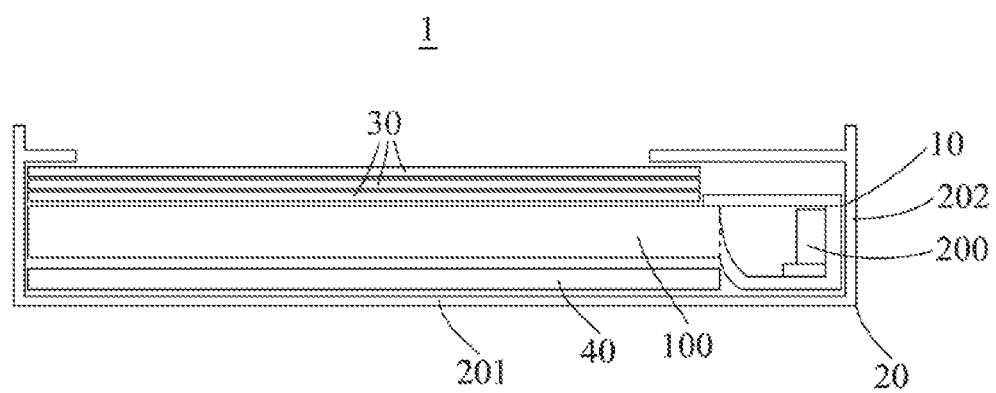
FIG. 2 is a structural diagram of a backlight module according to an embodiment of the present disclosure.

FIG. 2 illustrates a structural diagram of a backlight module according to an embodiment of the present disclosure.

As shown in FIG. 2, the backlight module 1 of the present disclosure may include an area light source assembly 10, a back-frame 20 and multiple optical diaphragms 30.

The back-frame 20 may include a bottom plate 210 and a side plate 202 extending from the bottom plate. The side plate 202 may be substantially perpendicular to the bottom plate 201. The area light source assembly 10 may be arranged on the bottom plate 201, and the light emitting top face 111 of the area light source assembly 10 may be opposite to the bottom plate 201.

The optical diaphragms 30 may be successively arranged on the light emitting top face 111. The optical diaphragms 30 may include, for example, a lower diffusion sheet, a lower brightness enhancement film and an upper brightness enhancement film, but are not limited thereto. These optical diaphragms 30 may improve optical performance of light emitted from the light emitting top face 111. In this embodiment, the thicknesses of the optical diaphragms 30 and gaps therebetween do not need to be adjusted.

Further, in order to disable total reflection inside the light guide plate 100 so as to make light evenly distributed, in this embodiment, several dot-patterns (not shown) may be set on the bottom face 112.

Moreover, in order to improve light utilization, the backlight module 1 may further include a reflection sheet 40. The reflection sheet 40 may be arranged between the bottom face 112 and the bottom plate 201. Thus, light exiting from the bottom face 112 may be reflected back into the light guide plate 100 by the reflection sheet 40 so as to improve light utilization.

Figure 3:
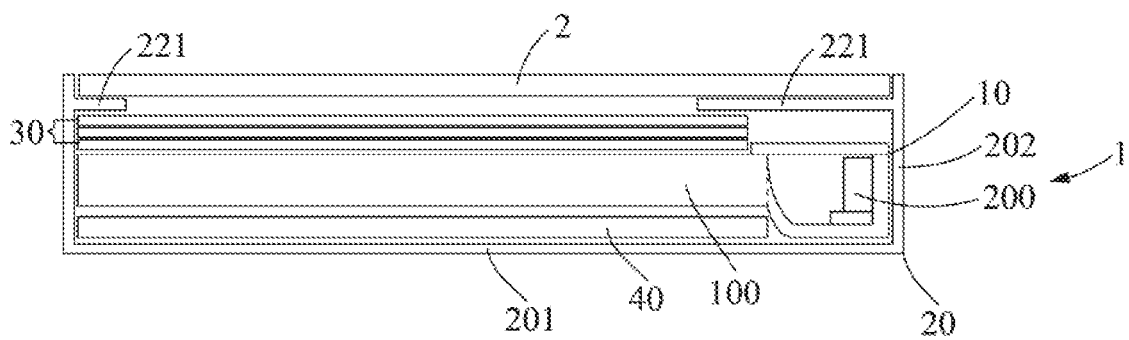
FIG. 3 is a structural diagram of a liquid crystal display according to an embodiment of the present disclosure.

FIG. 3 shows a structural diagram of a liquid crystal display according to an embodiment of the present disclosure.

As shown in FIG. 3, the liquid crystal display of the present disclosure may include a backlight module 1 and a liquid crystal panel 2. The side plate 202 may include a supporting plate 221 extending inward from the inner surface of the side plate and parallel to the bottom plate 201. The supporting plate 221 may be located above the optical diaphragms 30, and the liquid crystal panel 2 may be supported by the supporting plate 221. In this implementation, light emitted from the light emitting top face 111 may pass through the optical diaphragms 30 and get better optical performance, then it can be provided for use of the liquid crystal panel 2.

In the present disclosure, where light rays emitted by the backlight module satisfy a pre-determined light amount, pre-determined light brightness, a pre-determined optical property, etc., the thickness of the flat plate portion of the light guide plate can be adjusted at will, it thereby being possible to broaden the space of thinning of the backlight module without diminishing the gaps between other sheets.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. An area light source assembly, comprising:
a light guide plate comprising a flat plate portion and an accommodation portion, wherein the flat plate portion has a light incident side face and a light emitting top face, the accommodation portion is smoothly connected to the light incident side face; and
a light source received in the accommodation portion, wherein a light-emitting face of the light source faces the light incident side face of the flat plate portion;
wherein the accommodation portion comprises a bent plate, a horizontal plate and a vertical plate, and the bent plate, the horizontal plate and the vertical plate cooperatively define an accommodation cavity to receive the light source; wherein a first end of the bent plate is smoothly connected to the light incident side face, a second end of the bent plate is connected to a first end of the horizontal plate, a second end of the horizontal plate is connected to a first end of the vertical plate, an end surface of a second end of the vertical plate is flush with the light emitting top face;
wherein a normal direction of the horizontal plate is parallel to a normal direction of the light emitting top face, a normal direction of the vertical plate is parallel to a normal direction of the light incident side face, wherein a length of the vertical plate is greater than the thickness of flat plate portion.

2. The area light source assembly of claim 1, wherein the light source comprises an LED light and a flexible printed circuit;
the LED light comprises the light-emitting face, a fixing surface opposite to the light-emitting face, and a connecting surface connected to both the light-emitting face and the fixing surface;
the connecting surface is set on the flexible printed circuit, the flexible printed circuit is arranged on an inner surface of the horizontal plate, the fixing surface is fixed on an inner surface of the vertical plate.

3. The area light source assembly of claim 1, wherein a thickness of the flat plate portion is less than a thickness of the light source.

4. The area light source assembly of claim 1, wherein the accommodation cavity has an opening, and the light guide plate further comprises a reflection portion covering the opening, such that light reaching to the reflection portion surface is reflected back into the accommodation cavity by the reflection portion.

5. The area light source assembly of claim 1, wherein at least one of an inner surface of the bent plate, an inner surface of the horizontal plate and an inner surface of the vertical plate is arranged with a light reflection layer.

6. The area light source assembly of claim 5, wherein the inner surface of the bent plate except for a portion connected to the light incident side face is arranged with the light reflection layer.

7. The area light source assembly of claim 1, wherein the bent plate extends in a direction away from the accommodation cavity; or the bent plate bend outwardly.

8. The area light source assembly of claim 1, wherein the light guide plate further comprises a bottom surface, and the bottom surface is arranged with multiple dot-patterns.

9. A backlight module, comprising:
an area light source assembly comprising:
a light guide plate comprising a flat plate portion and an accommodation portion, wherein the flat plate portion has a light incident side face and a light emitting top face, the accommodation portion is smoothly connected to the light incident side face; and
a light source received in the accommodation portion, wherein a light-emitting face of the light source faces the light incident side face of the flat plate portion, a thickness of the flat plate portion is less than a thickness of the light source;
a back-frame comprising a bottom plate and a side plate extending from the bottom plate,
wherein the area light source assembly is set on the bottom plate, and the light emitting top face is opposite to the bottom plate; and
a plurality of optical diaphragms successively arranged on the light emitting top face,
wherein the accommodation portion comprises a bent plate, a horizontal plate and a vertical plate, and the bent plate, the horizontal plate and the vertical plate cooperatively define an accommodation cavity to receive the light source; wherein a first end of the bent plate is smoothly connected to the light incident side face, a second end of the bent plate is connected to a first end of the horizontal plate, a second end of the horizontal plate is connected to a first end of the vertical plate, an end surface of a second end of the vertical plate is flush with the light emitting top face;
wherein a normal direction of the horizontal plate is parallel to a normal direction of the light emitting top face, a normal direction of the vertical plate is parallel to a normal direction of the light incident side face,
Wherein a length of the vertical plate is greater than the thickness of flat plate portion.

10. The backlight module of claim 9, wherein the light guide plate further comprises a bottom surface, and the backlight module further comprise a reflection sheet located between the bottom plate and the bottom surface of the light guide plate, wherein the bottom surface is opposite and parallel to the light emitting top face, the light incident side face is connected between the bottom surface and the light emitting top face.

11. The backlight module of claim 10, wherein the bottom surface is arranged with multiple dot-patterns.

12. The backlight module of claim 10, the side plate comprises a supporting plate extending inward from an inner surface of the side plate and parallel to the bottom plate, wherein the supporting plate is located above the plurality of optical diaphragms for supporting a liquid crystal panel.

13. The backlight module of claim 9, wherein the accommodation portion comprises a bent plate, a horizontal plate and a vertical plate, and the bent plate, the horizontal plate and the vertical plate cooperatively define an accommodation cavity to receive the light source; wherein a first end of the bent plate is smoothly connected to the light incident side face, a second end of the bent plate is connected to a first end of the horizontal plate, a second end of the horizontal plate is connected to a first end of the vertical plate, an end surface of a second end of the vertical plate is flush with the light emitting top face.

14. The backlight module of claim 9, wherein a normal direction of the horizontal plate is parallel to a normal direction of the light emitting top face, a normal direction of the vertical plate is parallel to a normal direction of the light incident side face.

15. The backlight module of claim 9, wherein the light source comprises an LED light and a flexible printed circuit;
wherein the LED light comprises the light-emitting face, a fixing surface opposite to the light-emitting face, and a connecting surface connected to both the light-emitting face and the fixing surface;
wherein the connecting surface is set on the flexible printed circuit, the flexible printed circuit is arranged on an inner surface of the horizontal plate, the fixing surface is fixed on an inner surface of the vertical plate.

16. The backlight module of claim 9, wherein the accommodation cavity has an opening, and the light guide plate further comprises a reflection portion covering the opening, such that light reaching to the reflection portion surface is reflected back into the accommodation cavity by the reflection portion.

17. The backlight module of claim 9, wherein at least one of an inner surface of the bent plate, an inner surface of the horizontal plate and an inner surface of the vertical plate is arranged with a light reflection layer; wherein the inner surface of the bent plate except for a portion connected to the light incident side face is arranged with the light reflection layer.

18. The backlight module of claim 9, wherein the light guide plate further comprises a bottom surface, and the bottom surface is arranged with multiple dot-patterns.

19. A liquid crystal display, comprising: a backlight module and a liquid crystal panel supported by the backlight module;
wherein the backlight module comprises:
a light guide plate comprising a flat plate portion and an accommodation portion, wherein the flat plate portion has a light incident side face and a light emitting top face, the accommodation portion is smoothly connected to the light incident side face; and
a light source received in the accommodation portion, wherein a light-emitting face of the light source faces the light incident side face of the flat plate portion, a thickness of the flat plate portion is less than a thickness of the light source;
a back-frame comprising a bottom plate and a side plate extending from the bottom plate, wherein the area light source assembly is set on the bottom plate, and the light emitting top face is opposite to the bottom plate; and
a plurality of optical diaphragms successively arranged on the light emitting top face;
wherein the side plate comprises a supporting plate extending inward from an inner surface of the side plate and parallel to the bottom plate, wherein the supporting plate is located above the plurality of optical diaphragms;
wherein the liquid crystal panel is supported by the supporting plate;

wherein the accommodation portion comprises a bent plate, a horizontal plate and a vertical plate, and the bent plate, the horizontal plate and the vertical plate cooperatively define an accommodation cavity to receive the light source;

wherein a first end of the bent plate is smoothly connected to the light incident side face, a second end of the bent plate is connected to a first end of the horizontal plate, a second end of the horizontal plate is connected to a first end of the vertical plate, an end surface of a second end of the vertical plate is flush with the light emitting top face, wherein a length of the vertical plate is greater than the thickness of flat plate portion.

* * * * *